United States Patent
Park

(10) Patent No.: US 7,338,899 B2
(45) Date of Patent: Mar. 4, 2008

(54) METHOD OF FORMING CONTACT PLUG IN SEMICONDUCTOR DEVICE

(75) Inventor: Shin Seung Park, Kyeongki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/295,115

(22) Filed: Dec. 6, 2005

(65) Prior Publication Data

US 2006/0270218 A1    Nov. 30, 2006

(30) Foreign Application Priority Data

May 30, 2005    (KR) ............... 10-2005-0045698

(51) Int. Cl.
*H01L 21/44*    (2006.01)
(52) U.S. Cl. .................. 438/675; 438/597
(58) Field of Classification Search ........... 438/597, 438/675, 738
See application file for complete search history.

(56) References Cited

U.S. PATENT DOCUMENTS

| | | | |
|---|---|---|---|
| 4,936,950 A * | 6/1990 | Doan et al. ............. | 438/634 |
| 6,040,242 A * | 3/2000 | Kakehashi ............... | 438/672 |
| 6,221,775 B1 * | 4/2001 | Ference et al. ......... | 438/691 |
| 6,713,384 B1 * | 3/2004 | Elliott et al. ............ | 438/625 |
| 2004/0216843 A1 * | 11/2004 | Peng .................... | 156/345.31 |

* cited by examiner

*Primary Examiner*—Jerome Jackson
*Assistant Examiner*—Anthony Ho
(74) *Attorney, Agent, or Firm*—Marshall, Gerstein & Borun LLP

(57) ABSTRACT

A method of forming a contact plug of a semiconductor device wherein, after a contact plug is formed in an interlayer insulation film, the interlayer insulation film is selectively etched so that the top surface of the contact plug is higher than the top surface of the interlayer insulation film. It is thus possible to prevent generation of voids when a subsequent metal layer is formed in the interlayer insulation film.

1 Claim, 2 Drawing Sheets

METHOD OF FORMING CONTACT PLUG IN SEMICONDUCTOR DEVICE

CROSS-REFERENCE TO RELATED APPLICATION

Convention priority based on Korean Patent Application 10-2005-45698 filed May 30, 2005, is claimed.

BACKGROUND OF THE INVENTION

1. Field of the Invention

The invention relates generally to a method of forming a contact plug of a semiconductor device and, more particularly, to a method of forming a contact plug of a semiconductor device, wherein void phenomena are present when a subsequent metal layer is formed.

2. Discussion of Related Technology

In general, in fabricating a semiconductor device in one wafer, a plurality of contact holes may be formed and a contact plug is formed in the plurality of contact holes through the same process. For example, a contact plug may be formed in a plurality of contact holes having a different etch area and a different pattern shape while the contact hole has both a line shape and a hall shape like a source line contact hole of a flash memory and a drain contact hole of an isolation type.

FIGS. 1a and 1b are sectional views for illustrating a known method of forming a contact plug of a semiconductor device.

Referring to FIG. 1a, a source/drain junction unit 11 is formed in a semiconductor substrate 10. An interlayer insulation film 12 is formed on the entire surface of the semiconductor substrate 10 including the source/drain junction unit 11. An etch process is then performed to form a contact hole through which a predetermined region of the source/drain junction unit 11 is exposed. Thereafter, the contact hole is filled with a contact plug material 13.

Referring to FIG. 1b, an etch-back process is performed to form a contact plug 13 within the contact hole. The height of the contact plug 13 remaining within the contact hole is varied due to the loading effect, which occurs due to a difference in the etch area and a pattern of the line shape and the hall shape of the contact hole.

Thereafter, a metal layer 14 is formed on the entire surface of the semiconductor substrate 10 including the contact plug 13. At this time, as the height of the contact plug 13 remaining within the contact hole and the line width depending on the level of integration of the device are reduced, the contact size is reduced and a void 15 accordingly is generated within the metal layer 14 upon formation of the metal layer 14. The void 15 causes an electrical defect between the contact plug 13 and the metal layer 14.

SUMMARY OF THE INVENTION

The invention is intended to eliminate as much as possible the generation of voids when a metal layer is formed over an interlayer insulation film and the contact plug in such a manner that after the contact plug is formed, the interlayer insulation film is selectively etched so that the top surface of the contact plug is higher than a top surface of the interlayer insulation film.

A method of forming a contact plug of a semiconductor device according to the invention therefore includes the steps of forming a source/drain junction unit on a semiconductor substrate, forming an interlayer insulation film including a contact hole on the entire surface of the semiconductor substrate including the source/drain junction unit, forming a contact plug in the contact hole, selectively etching the interlayer insulation film using an etch process so that a top surface of the interlayer insulation film becomes lower than a top surface of the contact plug, and forming a metal layer on the interlayer insulation film including the contact plug.

DETAILED DESCRIPTION OF PREFERRED EMBODIMENTS

The invention will now be described in connection with preferred embodiments with reference to the accompanying drawings.

Since preferred embodiments are provided for the purpose that persons of ordinary skill in the art are able to understand the invention, they may be modified in various manners and the scope of the invention is not limited by the preferred embodiments described herein.

Figure 1A:
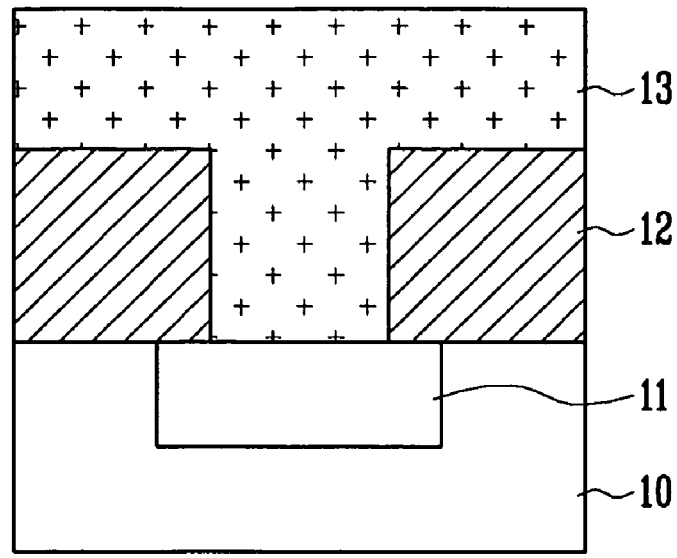
FIGS. 1a and 1b are sectional views for illustrating a prior art method of forming a contact plug of a semiconductor device.
Figure 1B:
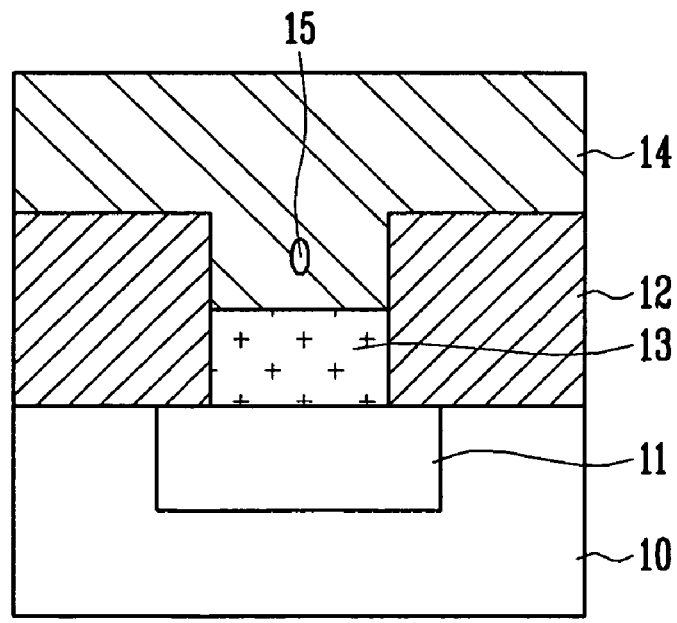
Figure 2A:
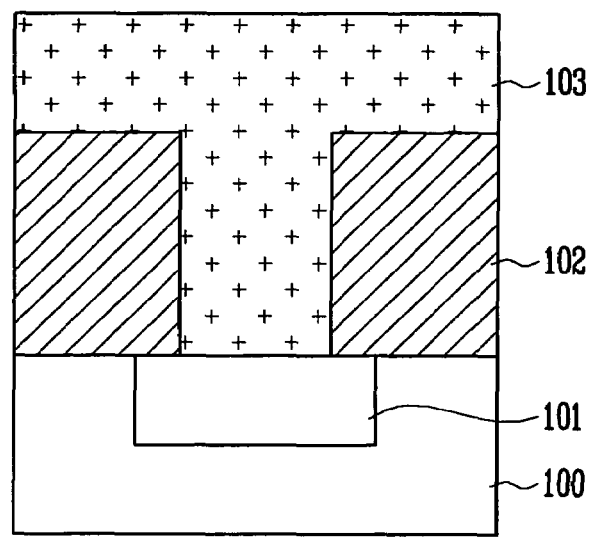
FIGS. 2a to 2c are sectional views for illustrating a method of forming a contact plug of a semiconductor device according to the invention.
Figure 2B:
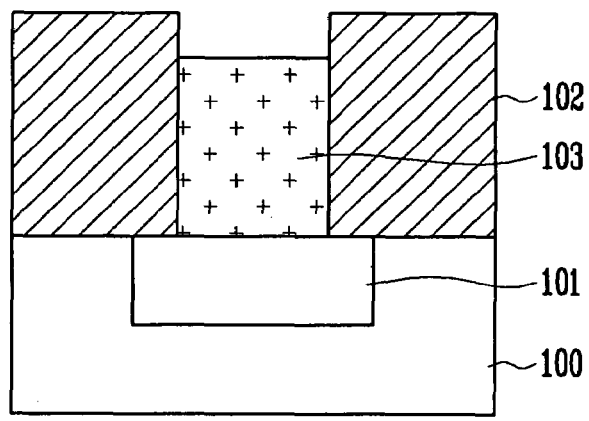
Figure 2C:
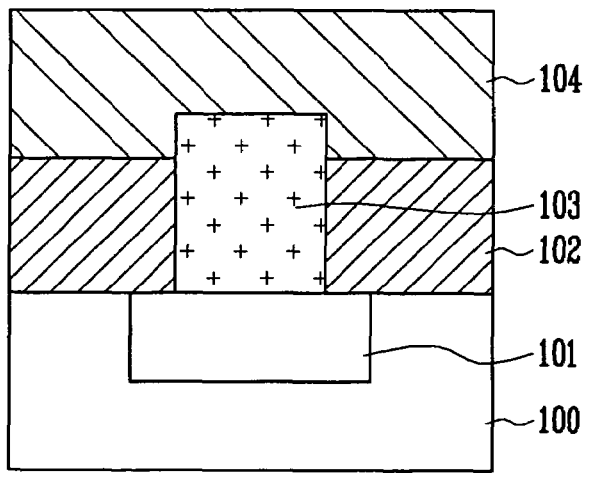

FIGS. 2a to 2c are sectional views for illustrating a method of forming a contact plug of a semiconductor device according to the invention.

Referring to FIG. 2a, a source/drain junction unit 101 is formed on a semiconductor substrate 100, such as by an ion implant process, for example. An interlayer insulation film 102 is formed on the entire surface of the semiconductor substrate 100, including the source/drain junction unit 101. The interlayer insulation film 102 is etched to form a contact hole. Thereafter, a contact plug material 103 is formed on the entire surface of the semiconductor substrate 100 including the contact hole.

Referring to FIG. 2b, a contact plug material 103 is etched by an etch-back process so that the interlayer insulation film 102 is exposed. Therefore, the contact plug material 103 remains within the contact hole, thus forming the contact plug 103.

Referring to FIG. 2c, an etch process is performed to selectively etch the interlayer insulation film 102. The etch process is carried out until a top surface of the contact plug 103 becomes higher than a top surface of the interlayer insulation film 102. The etch process can employ dry etch mode using a plasma scheme or wet etch mode using an etchant, as desired Thereafter, a metal layer 104 is formed on the interlayer insulation film 102 including the contact plug 103. As the contact plug 103 is protruded, it prevents generation of voids when the metal layer 104 is formed.

As described above, in accordance with the invention, after a contact plug is formed, an interlayer insulation film is selectively etched so that a top surface of the contact plug is higher than a top surface of the interlayer insulation film. It is thus possible to prevent generation of voids when a subsequent metal layer is formed.

Although the foregoing description has been made with reference to the preferred embodiments, it is to be understood that changes and modifications of the invention may be made by the ordinary skilled in the art without departing from the spirit and scope of the invention and appended claims.

What is claimed is:

1. A method of forming a contact plug of a semiconductor device, comprising the steps of:
   forming a source/drain junction unit on a semiconductor substrate housing a surface;
   forming an interlayer insulation film being one layer over the semiconductor substrate including the source/drain junction unit;
   forming a contact hole by etching the interlayer insulation film;
   forming a material for the contact plug over the interlayer insulation film;
   forming a contact plug having a top surface in the contact hole by using an etch back process to expose a top surface of the interlayer insulation film;
   selectively etching the interlayer insulation film using a wet etch process using an etchant so that the top surface of the contact plug becomes higher than the top surface of the interlayer insulation film; and
   forming a metal layer on the interlayer insulation film including the contact plug.

* * * * *